(12) United States Patent
Shido

(10) Patent No.: US 9,564,206 B2
(45) Date of Patent: Feb. 7, 2017

(54) SEMICONDUCTOR DEVICE

(71) Applicant: PS4 Luxco S.a.r.l., Luxembourg (LU)

(72) Inventor: Taihei Shido, Tokyo (JP)

(73) Assignee: Longitude Semiconductor S.A.R.L., Luxembourg (LU)

( * ) Notice: Subject to any disclaimer, the term of this patent is extended or adjusted under 35 U.S.C. 154(b) by 0 days.

(21) Appl. No.: 14/891,272

(22) PCT Filed: May 14, 2014

(86) PCT No.: PCT/JP2014/062790
§ 371 (c)(1),
(2) Date: Nov. 13, 2015

(87) PCT Pub. No.: WO2014/185441
PCT Pub. Date: Nov. 20, 2014

(65) Prior Publication Data
US 2016/0118105 A1    Apr. 28, 2016

(30) Foreign Application Priority Data

May 16, 2013 (JP) ................. 2013-104005

(51) Int. Cl.
*G11C 16/04* (2006.01)
*G11C 11/4093* (2006.01)
(Continued)

(52) U.S. Cl.
CPC ......... *G11C 11/4093* (2013.01); *G11C 7/1006* (2013.01); *G11C 7/1096* (2013.01);
(Continued)

(58) Field of Classification Search
CPC ..... G11C 7/1006; G11C 29/42; G11C 11/406; G11C 2211/4061; G11C 2211/4062; G11C 7/1072; G11C 29/44; G11C 11/401; G11C 11/40615; G11C 11/40618; G11C 11/4076; G11C 11/4096; G11C 2029/4402
(Continued)

(56) References Cited

U.S. PATENT DOCUMENTS 6,324,626 B1    11/2001  Uenoyama et al.
2002/0080652 A1  6/2002  Kendall et al.
(Continued)

FOREIGN PATENT DOCUMENTS

JP    201003299 A    1/2010
JP    2012502391 A   1/2012
(Continued)

OTHER PUBLICATIONS

PCT/JP2014/062790, International Search Report, issued Jul. 29, 2014, 3 pages.

*Primary Examiner* — Thong Q Le

(57) ABSTRACT

Embodiments of the present invention relate to a latch circuit (L20) which latches a data mask signal (DM) in response to a one-shot signal (NS), and changes the data mask signal (DM) to an active level in response to an error signal (ERR), which indicates that an error is present in write data (DQ), being at an active level; a buffer circuit (BF2) which outputs the data mask signal (DM) that has been latched by the latch circuit (L20), said data mask signal (DM) being output in response to a write clock signal (WCLK2); and a main amplifier (80) which outputs the write data (DQ) to an internal circuit on the condition that the data mask signal (DM) which has been output from the buffer circuit (BF2) is at an inactive level. The present invention can prevent the writing of erroneous write data, and is capable of preventing increased chip surface area.

12 Claims, 13 Drawing Sheets

| 12 | Row decoder | 43 | Command decoder |
| 13 | Column decoder | 44 | Control logic circuit |
| 14 | Sensing circuit | 45 | Output circuit |
| 15 | Data controller | 46 | Power source circuit |
| 16 | FIFO circuit | 50 | Row control circuit |
| 17 | Data input/output circuit | 51 | Address buffer |
|  |  | 52 | Refresh counter |
| 18 | Strobe circuit | 60 | Column control circuit |
| 19 | Strobe controller |  |  |
| 40 | Clock generator | 61 | Address buffer |
| 42 | Mode register | 62 | Burst counter |

(51) Int. Cl.
  *G11C 7/10* (2006.01)
  *G11C 11/4076* (2006.01)
  *G11C 11/4096* (2006.01)
  *G11C 29/44* (2006.01)

(52) U.S. Cl.
  CPC ...... *G11C 11/4076* (2013.01); *G11C 11/4096* (2013.01); *G11C 29/44* (2013.01); *G11C 7/1087* (2013.01)

(58) Field of Classification Search
  USPC .... 365/233.1, 189.05, 200, 201, 203, 225.7, 365/150, 154, 182, 189.15, 189.16, 190, 365/207, 222, 230.03, 230.06, 230.08
  See application file for complete search history.

(56) References Cited

U.S. PATENT DOCUMENTS

| | | |
|---|---|---|
| 2004/0174747 A1 | 9/2004 | Tanaka et al. |
| 2004/0221098 A1* | 11/2004 | Ito .................. G06F 11/106 711/106 |
| 2010/0306721 A1 | 12/2010 | Anpo |
| 2012/0047410 A1 | 2/2012 | Sato et al. |

FOREIGN PATENT DOCUMENTS

| | | |
|---|---|---|
| JP | 201373664 A | 4/2013 |
| JP | 201374560 A | 4/2013 |
| TW | 303465 B | 4/1997 |
| TW | 403907 B | 9/2000 |

\* cited by examiner

| 12 | Row decoder | 43 | Command decoder |
| 13 | Column decoder | 44 | Control logic circuit |
| 14 | Sensing circuit | 45 | Output circuit |
| 15 | Data controller | 46 | Power source circuit |
| 16 | FIFO circuit | 50 | Row control circuit |
| 17 | Data input/output circuit | 51 | Address buffer |
| | | 52 | Refresh counter |
| 18 | Strobe circuit | 60 | Column control circuit |
| 19 | Strobe controller | | |
| 40 | Clock generator | 61 | Address buffer |
| 42 | Mode register | 62 | Burst counter |

| 11 | Memory cell array | 80 | Main amplifier |
| --- | --- | --- | --- |
| 17a, 17b | Input buffer | 90 | Verification circuit |
| 70 | Error control circuit | | |

Fig. 3

Burst Input Order →

| DQ0 | DQ00 | DQ10 | DQ20 | DQ30 | DQ40 | DQ50 | DQ60 | DQ70 | CRC0 |
|---|---|---|---|---|---|---|---|---|---|
| DQ1 | DQ01 | DQ11 | DQ21 | DQ31 | DQ41 | DQ51 | DQ61 | DQ71 | CRC1 |
| DQ2 | DQ02 | DQ12 | DQ22 | DQ32 | DQ42 | DQ52 | DQ62 | DQ72 | CRC2 |
| DQ3 | DQ03 | DQ13 | DQ23 | DQ33 | DQ43 | DQ53 | DQ63 | DQ73 | CRC3 |
| DQ4 | DQ04 | DQ14 | DQ24 | DQ34 | DQ44 | DQ54 | DQ64 | DQ74 | CRC4 |
| DQ5 | DQ05 | DQ15 | DQ25 | DQ35 | DQ45 | DQ55 | DQ65 | DQ75 | CRC5 |
| DQ6 | DQ06 | DQ16 | DQ26 | DQ36 | DQ46 | DQ56 | DQ66 | DQ76 | CRC6 |
| DQ7 | DQ07 | DQ17 | DQ27 | DQ37 | DQ47 | DQ57 | DQ67 | DQ77 | CRC7 |

| DM | DM0 | DM1 | DM2 | DM3 | DM4 | DM5 | DM6 | DM7 |
|---|---|---|---|---|---|---|---|---|

81  Amplifier circuit

71  One-shot pulse generating circuit

| 11 | Memory cell array | 80 | Main amplifier |
| 17a, 17b | Input buffer | 90 | Verification circuit |
| 70 | Error control circuit | | |

71  One-shot pulse generating circuit

81  Amplifier circuit

71　One-shot pulse generating circuit

SEMICONDUCTOR DEVICE

TECHNICAL FIELD

The present invention relates to a semiconductor device and in particular relates to a semiconductor device comprising a detection circuit that detects whether or not an error is present in write data comprising a plurality of bits.

BACKGROUND TECHNOLOGY

In recent years, development of DDR4 (Double Data Rate 4) type DRAMs has been proceeding: these are DRAMs of even higher speed than DDR3 (Double Data Rate 3) type DRAMs (Dynamic Random Access Memories). DDR4 type DRAMs are provided with a new function, which is not present in DDR3 type DRAMs, namely, a CRC (Cyclic Redundancy Check) function, of detecting whether or not an error is present in write data (see Patent Reference 1).

With a CRC function, verification is performed as to whether or not an error is present in write data, by carrying out a calculation using a CRC code and write data comprising a plurality of bits. Then, if the result of the verification is that the write data contains an error, the write operation is discontinued.

PRIOR ART REFERENCES

Patent References

Patent Reference 1: Laid-open Japanese Patent Application 2013-73664

SUMMARY

However, since the calculation using the CRC code takes a certain amount of time, writing of the write data to the memory cell array has to wait for completion of the calculation using the CRC code. As a method of delaying writing of the write data, the method of inserting a plurality of latch circuit stages in the data bus has been considered, but, in this case, there was the problem that a large chip area was occupied by the multiple latch circuits.

A semiconductor device according to one aspect of the present invention comprises:

a verification circuit that sets an error signal to an active level in response to the presence of an error in write data comprising a plurality of bits; a latch circuit that latches a data mask signal in response to a first timing signal and changes said latched data mask signal to an active level in response to said error signal being active-level; a buffer circuit that outputs said data mask signal that was latched in said latch circuit in response to a second timing signal; and a main amplifier that outputs said write data to an internal circuit under the condition that said data mask signal that was output from said buffer circuit is an inactive level; and is characterized in that said first timing signal is activated prior to actuation of said second timing signal; said second timing signal is activated after the level of said error signal has been established; and no other latch circuit that performs a latching operation synchronized with at least said first timing signal is interposed between said latch circuit and said buffer circuit.

A semiconductor device according to another aspect of the present invention comprises: a main amplifier; a data bus that transfers write data comprising a plurality of bits to said main amplifier; a data mask bus that transfers a data mask signal to said main amplifier; a verification circuit that sets an error signal to an active level in response to the presence of an error in said write data; a control circuit that changes the first timing signal from a first logic level to a second logic level with the timing with which said write data is supplied to said data bus and thereafter changes said first timing signal from said second logic level to said first logic level prior to supply of other write data to said data bus; a latch circuit inserted in said data mask bus and that latches said data mask signal in response to the change of said first timing signal from said second logic level to said first logic level; and a buffer circuit inserted in said data mask bus and that outputs said data mask signal that was latched in said latch circuit to said main amplifier; characterized in that said latch circuit, if said error level is an inactive level, outputs said data mask signal of the same level as the level of said data mask signal that was input through said data mask bus to said buffer circuit and, if said error signal is an active level, forcibly sets said data mask signal that is output to said buffer circuit to an active level, irrespective of the level of said data mask signal that was input through said data mask bus; and said main amplifier is activated under the condition that said data mask signal that was output from said buffer circuit is an inactive level.

With the present invention, if the write data contains an error, the data mask signal is activated, so writing of the erroneous write data can be discontinued. Also, according to the present invention, multiple latch circuits for delaying the write data can be dispensed with, so increase in the chip area can be prevented.

BRIEF DESCRIPTION OF THE DRAWINGS

FIG. 3 is a view given in explanation of the burst input sequence of write data DQ and a data mask signal DM.

DETAILED DESCRIPTION

Preferred embodiments of the present invention are described in detail below with reference to the appended drawings.

Figure 1:
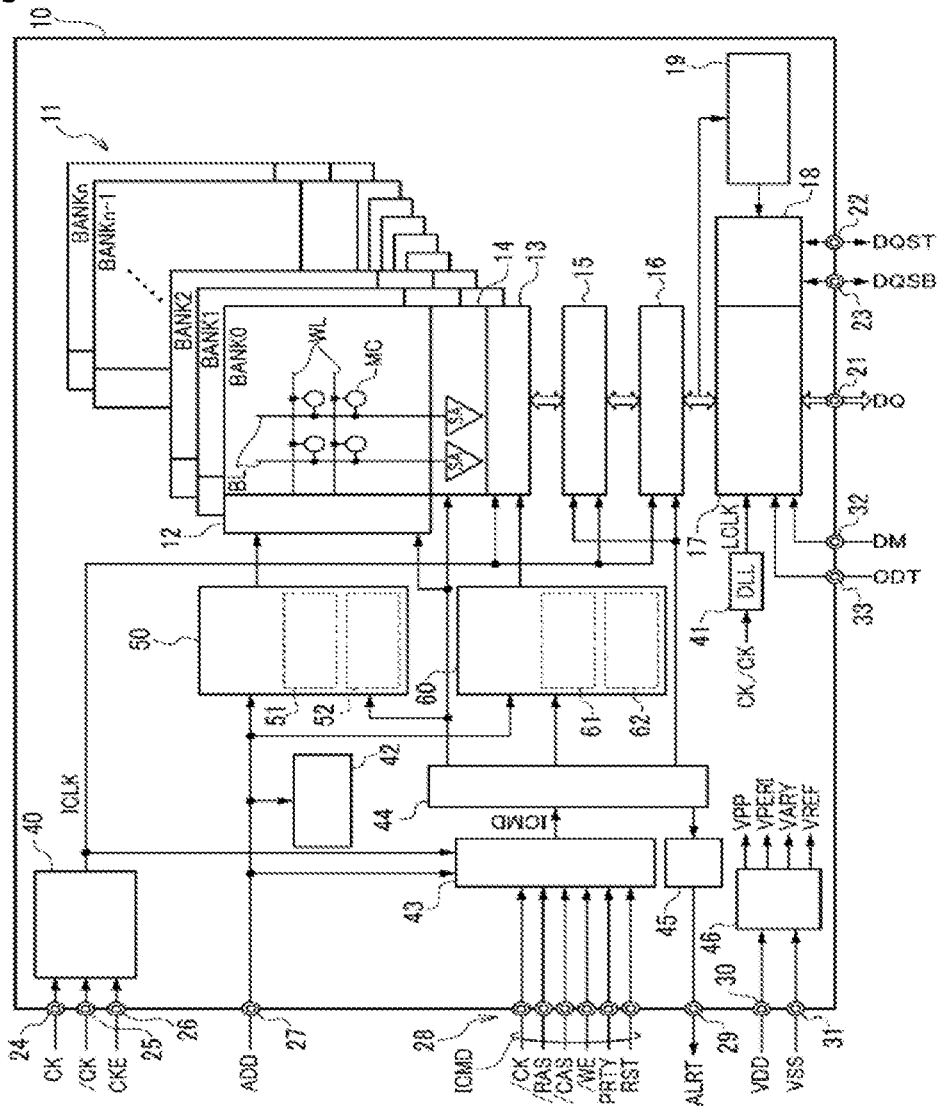
FIG. 1 is a block diagram showing the overall construction of a semiconductor device 10 according to a preferred embodiment of the present invention.

FIG. 1 is a block diagram showing the overall construction of a semiconductor device 10 according to a preferred embodiment of the present invention.

A semiconductor device 10 according to the present embodiment is a DRAM integrated on a single semiconductor chip; as shown in FIG. 1, it comprises a memory cell array 11 divided into n+1 banks. The banks are units capable of individually executing commands: basically, non-exclusive operation can be achieved between the banks.

In a memory cell array 11, there are provided a plurality of word lines WL intersecting with a plurality of bit lines BL: memory cells MC are arranged at these intersections. Selection of a word line WL is performed by a row decoder 12 and selection of a bit line BL is performed by a column decoder 13. The bit lines BL are respectively connected with the corresponding sensing amplifiers SA in a sensing circuit 14; the bit line BL selected by the column decoder 13 is connected with a data controller 15 through the sensing amplifier SA. The data controller 15 includes a main amplifier and/or verification circuit or the like, to be described, and is connected with a data input/output circuit 17 through a FIFO circuit 16. The data input/output circuit 17 is a circuit block that performs input/output of data through a data input/output terminal 21.

In the semiconductor device 10, apart from the data input/output terminal 21, there are provided for example, as external terminals, strobe terminals 22 and 23, clock terminals 24 and 25, a clock enable terminal 26, an address terminal 27, a command terminal 28, an alarm terminal 29, power source terminals 30 and 31, a data mask terminal 32, and an ODT terminal 33.

The strobe terminals 22 and 23 are terminals for input/output of respective external strobe signals DQST and DQSB. The external strobe signals DQST and DQSB are complementary signals that regulate the input/output timing of the data that is input/output through the data input/output terminal 21. Specifically, on data input, i.e. during a write operation, the external strobe signals DQST and DQSB are supplied to the strobe circuit 18 and the strobe circuit 18 controls the operating timing of the data input/output circuit 17 in accordance with these. In this way, the write data that is input through the data input/output terminal 21 is input to the data input/output circuit 17 in synchronization with the external strobe signals DQST, DQSB. In contrast, during data output, i.e. during a read operation, the operation of the strobe circuit 18 is controlled by a strobe controller 19. In this way, read data is output from the data input/output circuit in synchronization with the external strobe signals DQST, DQSB.

The clock terminals 24 and 25 are terminals at which respective external clock signals CK and /CK are input. The external clock signals CK and /CK which are thus input are supplied to a clock generator 40. In this specification, affixing the symbol "/" to the head of the name of a signal indicates that this signal is a low-active signal or the inverse of the corresponding signal. The external clock signals CK and /CK are therefore mutually complementary signals. The clock generator 40 is activated by a clock enable signal CKE that is input through the clock enable terminal 26, and generates an internal clock signal ICLK. Furthermore, the external clock signals CK and /CK that are supplied through the clock terminals 24 and 25 are also supplied to a DLL circuit 41. The DLL circuit 41 is a circuit that generates an output clock signal LCLK that is phase-controlled by the external clock signals CK and /CK. The output clock signal LCLK is employed as a timing signal that regulates the output timing of the read data by the data input/output circuit 17.

The address terminal 27 is a terminal that is supplied with an address signal ADD; this supplied address signal ADD is supplied for example to the row control circuit 50, the column control circuit 60, a mode register 42, and a command decoder 43. The row control circuit 50 is a circuit block that includes for example an address buffer 51 and refresh counter 52 and controls the row decoder 12 in accordance with the row address. Also, the column control circuit 60 is a circuit block that includes for example an address buffer 61 and/or burst counter and controls the column decoder 13 in accordance with the column address. Also, when an entry is made to the mode register set, the address signal ADD is supplied to the mode register 42 and the content of the mode register 42 is thereby updated.

The command terminal 28 is a terminal that is supplied with for example a chip select signal /CS, a row address strobe signal /RAS, a column address strobe signal /CAS, a write enable signal /WE, a parity signal PRTY and a reset signal RST. These command signals CMD are supplied to the command decoder 43 and the command decoder 43 generates internal commands ICMD based on these command signals CMD. The internal command signals ICMD are supplied to a control logic circuit 44. The control logic circuit 44 controls the operation of for example the row control circuit 50, the column control circuit 60 and the data controller 15 in accordance with the internal command signal ICMD.

The command decoder 43 includes a verification circuit, not shown. Using the parity signal PRTY, the verification circuit verifies the address signal ADD and command signal CMD; the result of this verification process, if an error is present in the address signal ADD or the command signal CMD, is to output an alert signal ALRT through the control logic circuit 44 and an output circuit 45. The alert signal ALRT is output to the outside through an alert terminal 29.

The power source terminals 30, 31 are terminals that are supplied with respective power source potentials VDD and VSS. The power source potentials VDD and VSS that are supplied through the power source terminals 30 and 31 are supplied to a power source circuit 46. The power source circuit 46 is a circuit block that generates various types of internal potential based on the power source potentials VDD and VSS. The internal potentials that are generated by the power source circuit 46 include a boosted potential VPP, a power source potential VPERI, an array potential VARY, and a reference potential VREF. The boosted potential VPP is generated by stepping up the power source potential VDD, and the power source potential VPERI, array potential VARY and reference potential VREF are generated by stepping down the external potential VDD.

The boosted potential VPP is a potential that is employed chiefly in the row decoder 12. The row decoder 12 drives the word line WL selected in accordance with the address signal ADD to VPP level, thereby causing the cell transistor contained in the memory cell MC to conduct. The internal potential VARY is a potential that is employed chiefly in the sensing circuit 14. When the sensing circuit 14 is activated, it amplifies the read data that has been read, by driving one side of the bit line pair to VARY level and the other side to VSS level. The power source potential VPERI is employed as the operating potential of most of the peripheral circuitry, such as the row control circuit 50 and the column control circuit 60. Employing a power source potential VPERI of lower potential than the power source potential VDD as the operating potential of these peripheral circuits makes it possible to reduce the power consumption of the semiconductor device 10. Also, the reference potential VREF is a potential that is employed in the data input/output circuit 17.

The data mask terminal 32 and ODT terminal 33 are terminals that are supplied with the data mask signal DM and the terminal signal ODT, respectively. The data mask signal DM and the terminal signal ODT are supplied to the data input/output circuit 17. The data mask signal DM is a signal that is activated when masking part of the write data or read data; the terminal signal ODT is a signal that is activated when the output buffer contained in the data input/output circuit 17 is employed as a terminal resistor.

The overall construction of the semiconductor device 10 according to the present embodiment is as above. Hereinbelow, the semiconductor device 10 according to the present embodiment will be described in further detail, focusing on the data controller 15.

Figure 2:
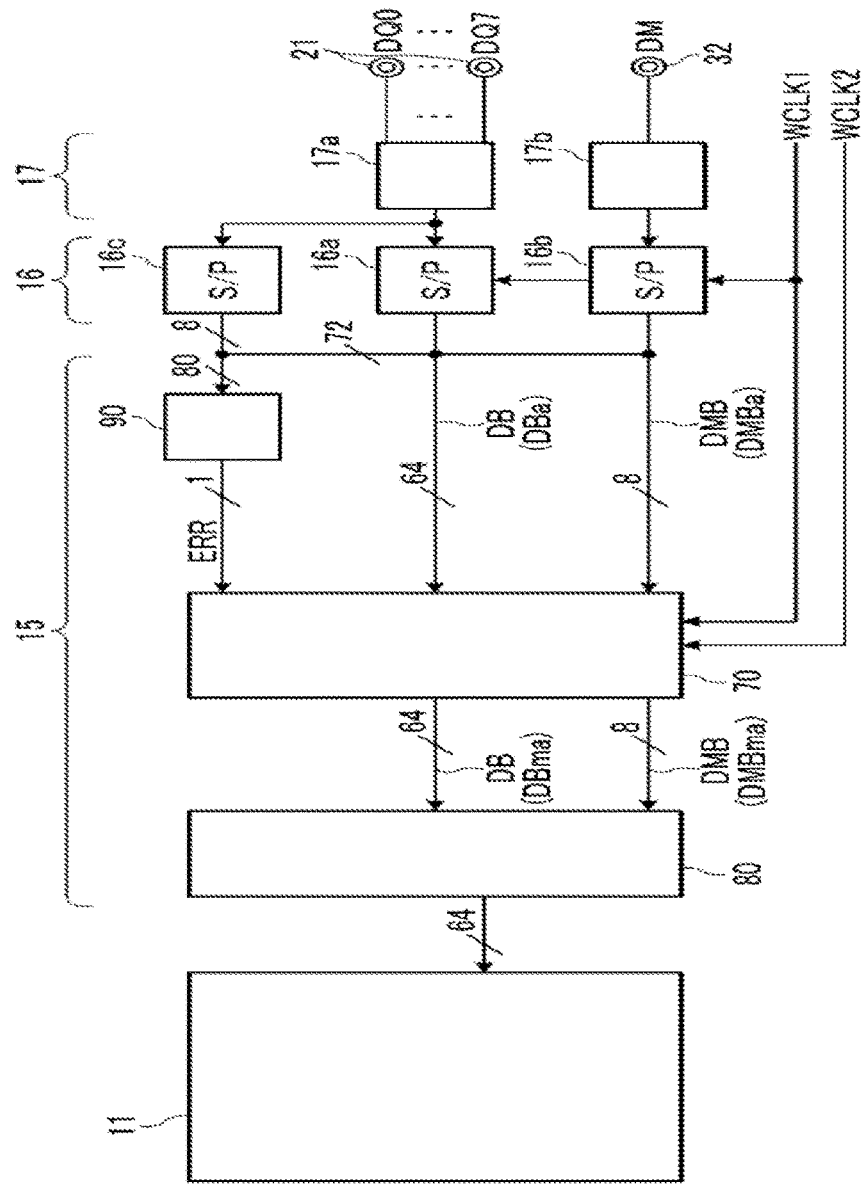
FIG. 2 is a block diagram showing a detail of a portion relating to the write operation in a semiconductor device 10.

FIG. 2 is a block diagram of a detail of the portion relating to write operation in the semiconductor device 10.

As shown in FIG. 2, in the present embodiment, eight data input/output terminals 21 are provided; these are used to input eight write data items DQ0$j$ to DQ7$j$ (where j=0 to 7) simultaneously through an input buffer 17a. Since, in the case of a DDR4 type DRAM, an 8-bit prefetch system is adopted, 8-bit write data items DQk0 to DQk7 (where k=0 to 7) are delivered by burst input in a single write operation to each individual data input/output terminal 21. In addition, as shown in FIG. 3, in the present embodiment, after burst-inputting write data DQ, a 1-bit CRC code is input to each data input/output terminal 21 through the input buffer 17a. Consequently, by a single write operation, a total of 72 bits, made up of a total 64-bit write data item DQ and 8-bit CRC code, are input through a data input/output terminal 21. Of such a 72-bit signal (DQ and CRC), the 64-bit write data item DQ is converted to parallel by a serial/parallel conversion circuit (S/P) 16a included in the FIFO circuit 16, and the 8-bit CRC code is converted to parallel by a serial/parallel conversion circuit (S/P) 16c included in the FIFO circuit 16.

On the other hand, at the data mask terminal 32, 8-bit data mask signals DM0 to DM7 are burst-input through an input buffer 17b in synchronization with the burst input of the write data DQk0 to DQk7. If the data mask signals DM0 to DM7 are active-level, the 8-bit write data items DQ0$j$ to DQ7$j$ that were input with this burst timing are invalidated. These 8-bit data mask signals DM0 to DM7 are converted to parallel by the serial/parallel conversion circuit (S/P) 16b contained in the FIFO circuit 16.

The 64-bit write data DQ that is output from the serial/parallel conversion circuit 16a is supplied to a 64-bit width data bus DB. Also, the 8-bit data mask signal DM that is output from the serial/parallel conversion circuit 16b is supplied to an 8-bit width data mask bus DMB. As shown in FIG. 2, the error control circuit 70 is inserted in the data bus DB and data mask bus DMB so that connection with the main amplifier 80 is effected through this error control circuit 70. This error control circuit 70 and main amplifier 80 are circuit blocks included in the data controller 15 shown in FIG. 1. The error control circuit 70 performs an operation synchronized with the write clock signals WCLK1 and WCLK2 that are supplied from the control logic circuit 44 (control circuit).

On the other hand, the 64-bit write data DQ that is output from the serial/parallel conversion circuit 16a, the 8-bit CRC signal that is output from the serial/parallel conversion circuit 16c, and the 8-bit data mask signal DM that is output from the serial/parallel conversion circuit 16b, making a total of 80 bits, are supplied to a verification circuit 90 included in the data controller 15. The verification circuit 90 performs CRC calculation using such an 80-bit signal, thereby verifying whether or not an error is present in the 64-bit write data DQ. As a result of this verification, if an error is present in the write data DQ, the error signal ERR is set to an active level; if no error is present, the error signal ERR is set to an inactive level. Since a certain amount of time is required for the CRC calculation using the verification circuit 90, the error signal ERR, whose level has thus been determined, reaches the error control circuit 70 later than the write data DQ and the data mask signal DM.

After having passed through the error control circuit 70, the write data DQ and data mask signal DM are supplied to the main amplifier 80. The main amplifier 80 executes the operation of writing the 64-bit write data DQ into the memory cell array in respect of write data DQ whereof the corresponding data mask signal DM is an inactive level and disables the writing operation into the memory cell array 11 in respect of write data DQ whereof the corresponding data mask signal DM is an active level. In this way, permission to write the write data DQ is controlled in accordance with the data mask signal DM.

At this point, if the error signal ERR is active-level, the error control circuit 70, irrespective of the level of the data mask signal DM that was input, changes all the 8-bit data mask signals DM0 to DM7 on the data mask bus DMB to an active level. In this way, if an error is generated in the write data DQ, writing of all of the write data DQ is disabled.

Figure 4:
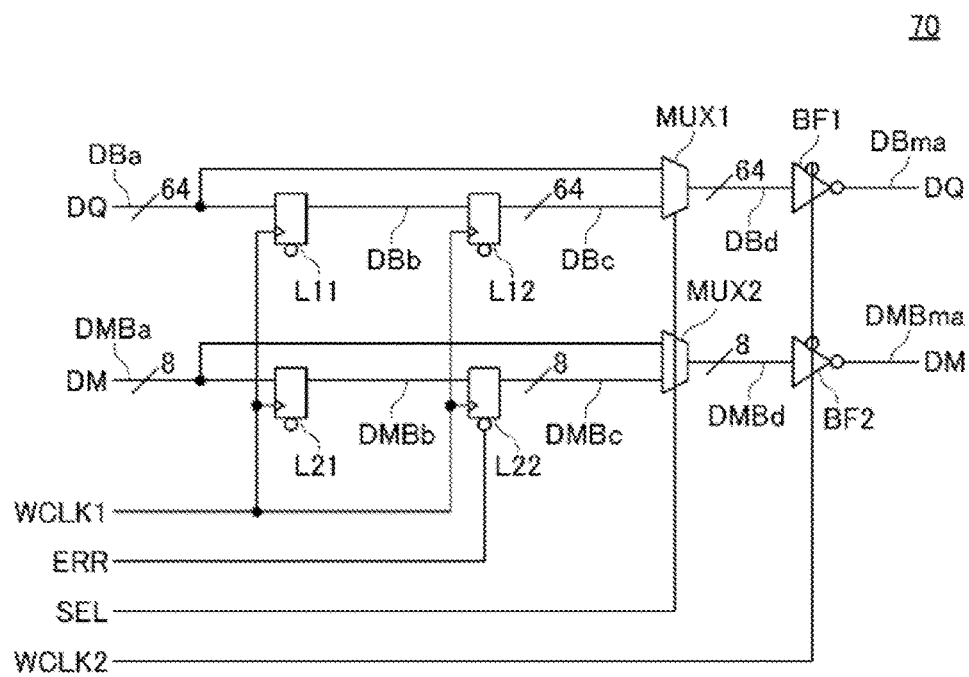
FIG. 4 is a block diagram showing the layout of an error control circuit 70 according to a prototype considered in the process whereby the present inventors arrived at the invention.

FIG. 4 is a block diagram showing the layout of the error control circuit 70 according to a prototype that was considered in the process of arriving at the invention by the present inventors.

In the error control circuit 70 according to the prototype shown in FIG. 4, the data bus DB is divided into five sections DBa to DBd and DBma. The initial section DBa is a portion where write data DQ is input from the serial/parallel conversion circuit 16a; the next section, DBb, is a portion that inputs this data after it has passed through a latch circuit L11; and the next section, DBc, thereafter is a portion that inputs this data after it has passed through a further latch circuit L12. The sections DBa and DBc are connected with the section DBd through a multiplexer MUX1. The section DBd is then connected with the final section DBma through a buffer circuit BF1. The final section DBma is a portion that is connected with the main amplifier 80.

This layout is the same also in the case of the data mask bus DMB. Specifically, the data mask bus DMB is divided into five sections DMBa to DMBd and the portion DMBma; the portion arrived at by going from the initial section DMBa through a latch circuit L21 is the next section DMBb and the portion arrived at by further passing through a latch circuit L22 is the next section DMBc. The sections DMBa and DMBc are connected with the section DMBd through a multiplexer MUX2. The section DMBd is then connected with the final section DMBma through a buffer circuit BF2. The final section DMBma is a portion that is connected with the main amplifier 80.

As shown in FIG. 4, the latch circuits L11, L12, L21 and L22 are circuits that perform a latching operation synchronized with the rising edge of the write clock signal WCLK1, which constitutes a first timing signal. At this point, it should be noted that, since the data bus DB is of 64-bit width and the data mask bus DMB is of 8-bit width, a total of 144 latch circuits are required, which occupy a large area on the chip.

The multiplexers MUX1 and MUX2 are circuits for changing over the configuration of the data bus DB and data mask signal DM depending on whether or not a CRC function is employed; these multiplexers input a selection signal SEL indicating whether or not the CRC function is employed. If the CRC function is employed, the sections DBc and DMBc are selected and a path via the latch circuits L11, L12, L21 and L22 thereby becomes effective. In contrast, if the CRC function is not employed, the sections DBa and DMBa are selected and a path that does not go through the latch circuits L11, L12, L21 and L22 thereby becomes effective.

The buffer circuits BF1 and BF2 are circuits that, by outputting the write data DQ and the data mask signal DM on the sections DBd and DMBd to the final sections DBma and DMBma, supply the signals to the main amplifier 80. The buffer circuits BF1 and BF2 are activated in synchronization with the write clock signal WCLK2, constituting a second timing signal.

If then, as shown in FIG. 4, an error signal ERR is input to the latch circuit L22 and this becomes active-level, irrespective of the level of the data mask signal DM on the section DMBb, the data mask signal DM on the section DMBc is forcibly made to become active-level. Thus, when the error signal ERR is activated, all of the 8-bit data mask signals DM0 to DM7 that are input to the main amplifier 80 become active-level, so all of the input operations of the 64-bit write data DQ are disabled. Of course, if the error signal ERR is inactive-level, the data mask signals DM0 to DM7 that are latched in the latch circuit L22 are directly output to the section DMBc through the section DMBb.

Figure 5:
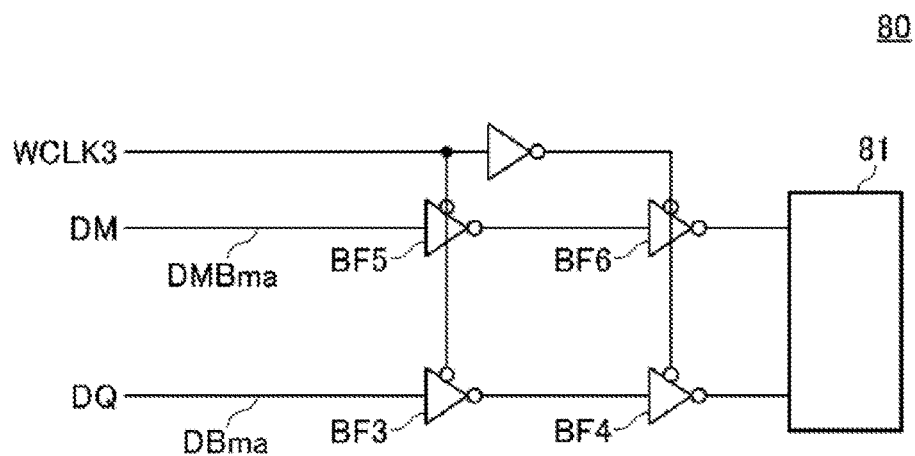
FIG. 5 is a block diagram showing the layout of a detail of a main amplifier 80.

FIG. 5 is a block diagram showing the layout of a detail of the main amplifier 80.

As shown in FIG. 5, the write data DQ that is supplied to the main amplifier 80 through the section DBma is input to an amplifier circuit 81 through buffer circuits BF3 and BF4 synchronized with a write clock signal WCLK3 and the data mask signal DM that is supplied to the main amplifier 80 through the section DMBma is input to the amplifier circuit 81 through buffer circuits BF5 and BF6 synchronized with the write clock signal WCLK3. The amplifier circuit 81 writes the corresponding write data DQ to the memory cell array 11 under the condition that the data mask signal DM is inactive-level. Consequently, if the 8-bit data mask signals DM0 to DM7 are all active-level, the write operation is disabled in respect of all of the 64-bit write data DQ.

Figure 6:
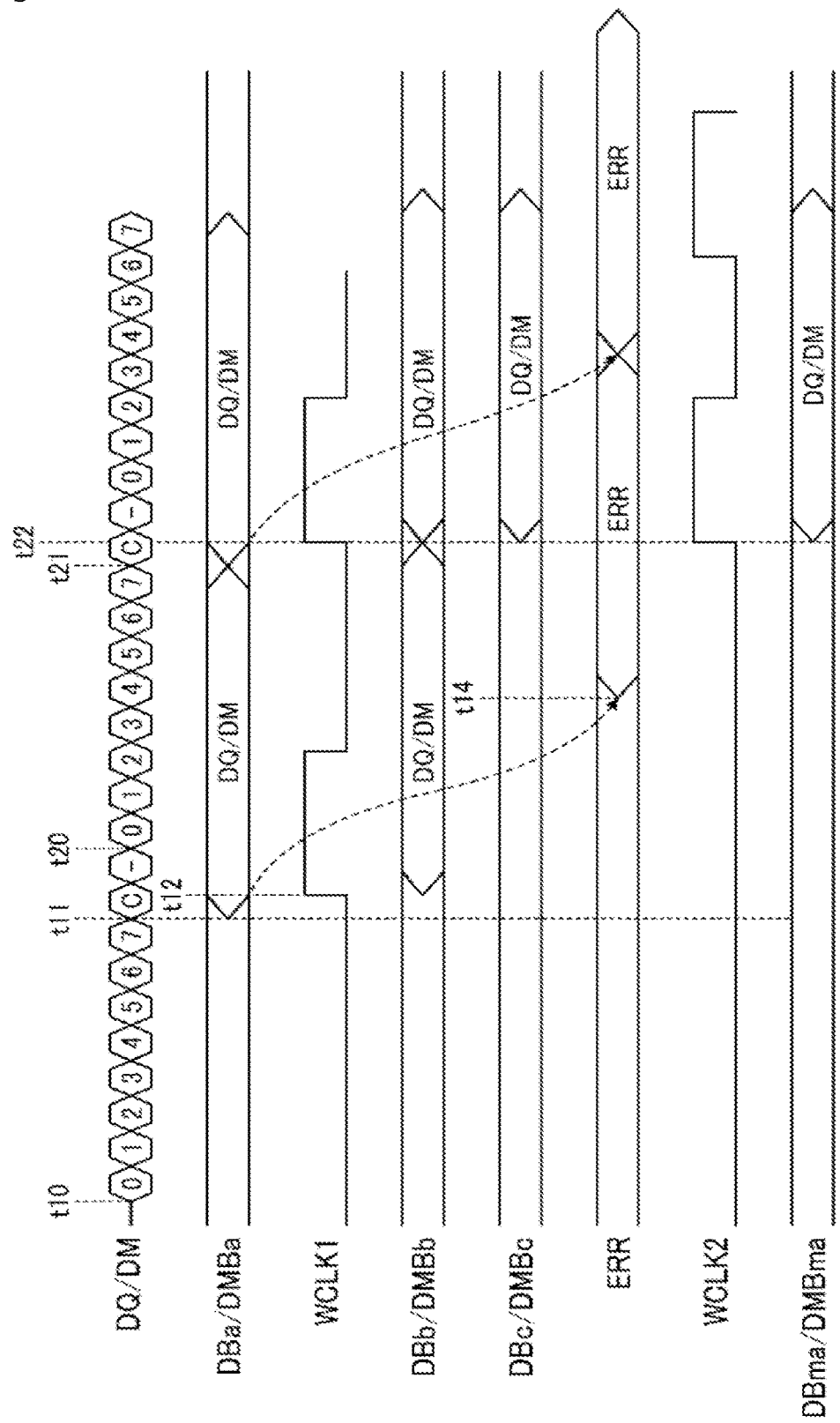
FIG. 6 is a timing chart given in explanation of the operation of the error control circuit 70 according to the prototype shown in FIG. 4.

FIG. 6 is a timing chart given in explanation of the operation of the error control circuit 70 according to the prototype shown in FIG. 4.

In the example shown in FIG. 6, the first write data DQ (and data mask signal DM) in the period defined by the time points t10 to t11 are input in burst fashion and the second write data DQ (and data mask signal DM) in the period defined by the time points t20 to t21 are input in burst fashion. Also, the CRC code (denoted by "C" in FIG. 6) is input immediately after the time points t11 and t21.

When the first burst input is completed at the time point t11, the parallel write data DQ and the data mask signal DM are manifested on the data bus section DBa and the data mask bus section DMBa by the serial/parallel conversion circuits 16a and 16b shown in FIG. 2. After this, at the time point t12, the write clock signal WCLK1 is activated and the write data DQ and data mask signal DM on the section DBa and the section DMBa are thereby transferred to the next section DBb and the section DMBb.

During this period, the CRC calculation is performed in the verification circuit 90 shown in FIG. 2, but a certain amount of time is required for the calculation, and the time at which this is completed is the time point t14. Thereafter, when the second burst input is completed at the time point t21, the next write data DQ and data mask signal DM are manifested on the data bus section DBa and data mask bus section DMBa.

After this, when the write clock signal WCLK1 is again activated at the time point t22, the first burst-input write data DQ (and data mask signal DM) are transferred from the section DBb and the section DMBb to the next section DBc and section DMBc; also, the second burst-input write data DQ (and data mask signal DM) are transferred from the section DBa and the section DMBa to the next section DBb and section DMBb.

At this time point, the CRC calculation corresponding to the first write data DQ has already been completed, so the level of the error signal ERR is thus established. Consequently, if the write data DQ should happen to contain an error, the latch circuit L22 would be forcibly reset, so an active-level data mask signal DM would be forcibly output to the section DMBc without the data mask signal DM being latched on the section DMBb.

Also, at the time point t22, the write clock signal WCLK2 is activated and the write data DQ and data mask signal DM on the section DBd and the section DMBd are thereby supplied to the main amplifier 80 through the buffer circuits BF1, BF2.

In this way, with the error control circuit 70 according to the second prototype, utilizing the write control signal WCLK1 that is activated every time the burst input is performed, the write data DQ and data mask signal DM are supplied to the main amplifier 80 in response to this being activated for the second time. Then, since establishment of the level of the error signal ERR takes place with a timing prior to the second activation of the write clock signal WCLK1 after its first activation, if the error signal ERR is active-level, the latching operation performed by the latch circuit L22 is disabled, so that the active-level data mask signal DM is forcibly output. In this way, it becomes possible to disable the writing operation of all of the burst-input write data DQ if an error is present in the write data DQ.

However, as mentioned above, with the error control circuit 70 according to the prototype, since a total of 144 latch circuits are required, there is the problem that these occupy a large area on the chip. With the error control circuit according to the embodiment of the present invention described below, improvement is effected in respect of this aspect, and reduction of the surface area can be achieved.

Figure 7:
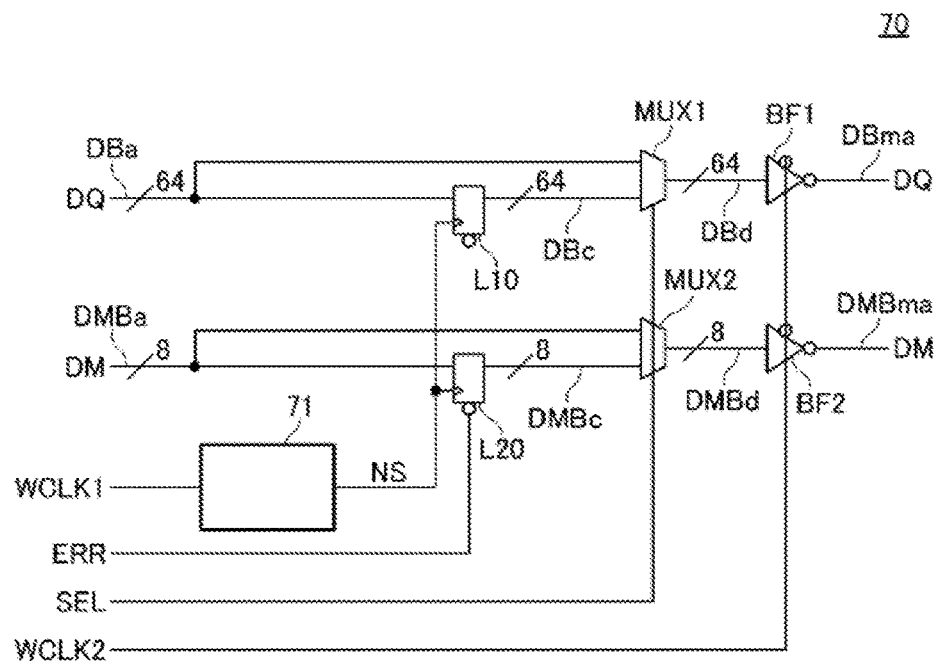
FIG. 7 is a block diagram showing the layout of an error control circuit 70 according to a first embodiment of the present invention.

FIG. 7 is a block diagram showing the layout of an error control circuit 70 according to a first embodiment of the present invention.

As shown in FIG. 7, the error control circuit 70 according to the present embodiment differs from the error control circuit 70 shown in FIG. 4 in that a single latch circuit L10 is provided instead of the latch circuits L11 and L12, a single latch circuit L20 is provided instead of the latch circuits L21 and L22, and a one-shot pulse generating circuit 71 is provided. The one-shot pulse generating circuit 71 is a circuit that generates a one-shot signal NS in response to the falling edge on receiving the write clock signal WCLK1. The one-shot signal NS is employed as a timing signal that determines the latch timing of the latch circuits L10 and L20. Other aspects are identical with the error control circuit 70 shown in FIG. 4, so duplicated description is avoided by attaching these same reference symbols to identical elements.

With this arrangement, with the error control circuit 70 according to this embodiment, the write data DQ and data mask signal DM are latched in response to the falling edge of the write clock signal WCLK1 and, thereafter, in response to the rising edge of the write clock signal WCLK2, and the write data DQ and data mask signal DM are supplied to the main amplifier 80.

Figure 8:
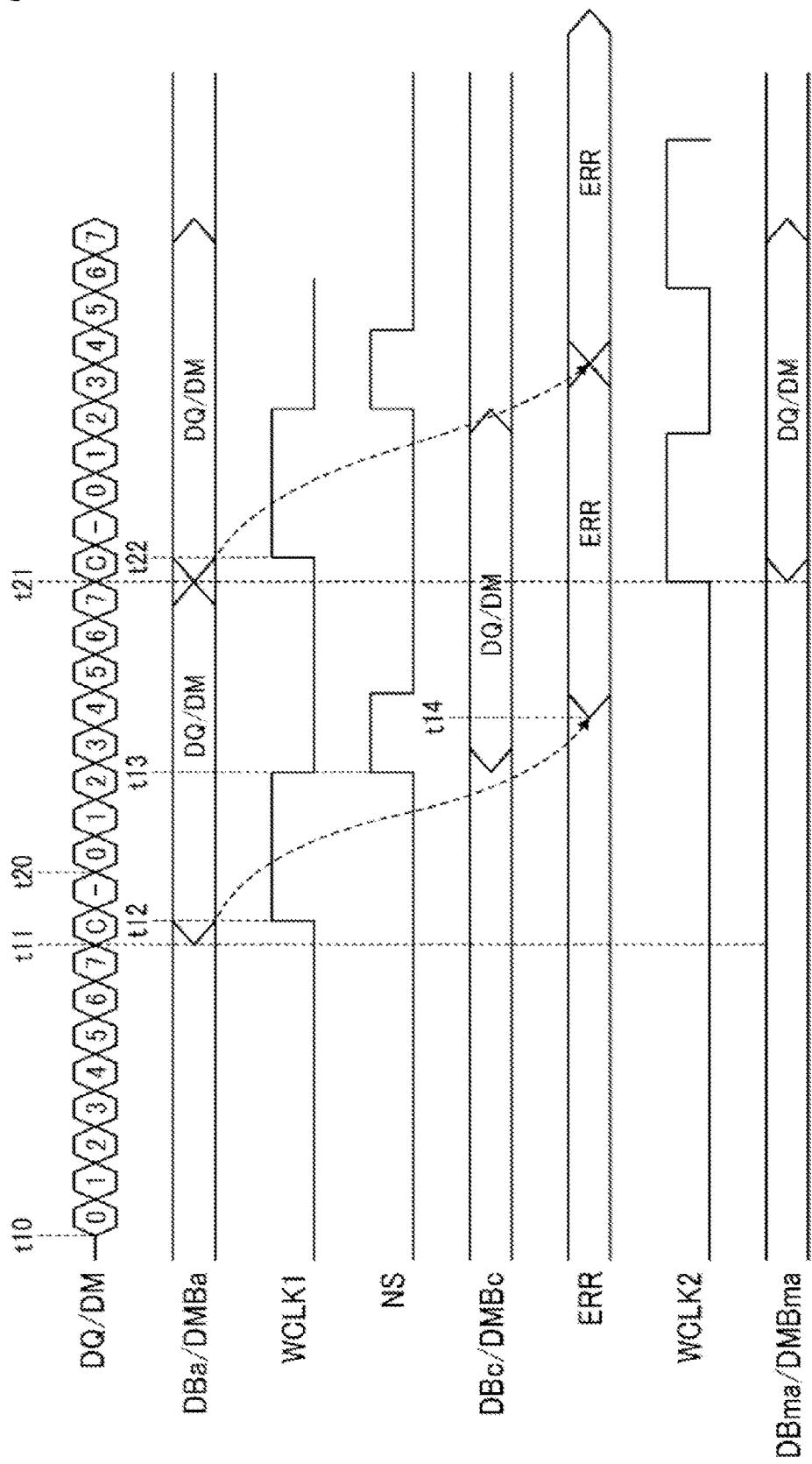
FIG. 8 is a timing chart given in explanation of the operation of the error control circuit 70 according to the first embodiment of the present invention.

FIG. 8 is a timing chart given in explanation of the operation of the error control circuit 70 according to this embodiment.

In the example shown in FIG. 8 also, just as in the case of the example shown in FIG. 6, the first write data DQ (and data mask signal DM) are burst-input in the period defined by the time points t10 to t11 and the second write data DQ (and data mask signal DM) are burst-input in the period defined by the time points t20 to t21.

In this embodiment also, when the first burst input is completed at the time point t11 and, as a result, the parallel write data DQ and data mask signal DM are manifested on the data bus section DBa and the data mask bus section DMBa, at the time point t12, the write clock signal WCLK1 changes from low-level to high-level. However, in this embodiment, the latching operation is performed in response to the change of the write clock signal WCLK1 from high-level to low-level at the time point t13, instead of the latching operation being performed in response to the rising edge of the write clock signal WCLK1. Consequently, in this embodiment, the write data DQ and the data mask signal DM on the section DBa and the section DMBa are transferred to the next section DBc and the section DMBc at the time point t13. Although there is no particular restriction to this, the interval of the time points t12 to t13 is two clock cycles.

However, at this time point, the CRC calculation has still not yet been completed, so the level of the error signal ERR has not been established. However, since, at this time point, the write clock signal WCLK2 is still in an inactive condition, the write data DQ and the data mask signal DM are not transferred to the section DBma and section DMBma.

After this, the level of the error signal ERR is established at the time point t14. Consequently, if an error is present in the write data DQ, the latch circuit L20 is forcibly reset, so the data mask signal DM on the sections DMBc and DMBd are forcibly changed to an active level.

Then, when the write clock signal WCLK2 is activated at the time point t21, the write data DQ and the data mask signal DM are transferred to the section DBma and the section DMBma and these signals are thus supplied to the main amplifier 80.

In this way, with the error control circuit 70 according to this embodiment, the write data DQ and the data mask signal DM are latched in response to the falling edge of the write clock signal WCLK1 and these signals are supplied to the main amplifier 80 in response to the rising edge of the write clock signal WCLK2. In this way, the number of latch circuits that need to be inserted in the data bus DB and the data mask bus DMB can be halved (72 latch circuits), compared with the prototype shown in FIG. 4.

Also, with this embodiment, since the latching operation by the latch circuit L20 is performed prior to the establishment of the level of the error signal ERR, although the data mask signal DM is supplied to the buffer circuit BF2 while this level has still not been established, since the buffer circuit BF2 is activated after establishment of the level of the error signal ERR, the data mask signal DM will be correctly supplied to the main amplifier 80 once the level has been established.

It should be noted that, although, with this embodiment, the latching operation of the latch circuits L10 and L20 is performed in response to the falling edge of the write clock signal WCLK1, there is no restriction to this and the latching operation could be performed in synchronization with another signal that is activated once only with a timing prior to that of activation of the write clock signal WCLK2, after the parallel write data DQ and data mask signal DM have been manifested on the sections DBa and DMBa. In this case also, the same beneficial effect as that of the present embodiment can be obtained.

For example, it may be arranged to perform the latching operation by the latch circuits L10 and L20 in response to the rising edge of the write clock signal WCLK1. However, in this case, the period (time points t21 to t22) that elapses before the write clock signal WCLK1 is activated in response to the next write data DQ after activation of the write clock signal WCLK2 is short, so the transfer margin is reduced compared with the present embodiment.

Alternatively, it may be arranged for another timing signal to be generated that is activated at about the time point t14 and for the latching operation of the latch circuits L10 and L20 to be performed in response to this timing signal. However, in this case, a signal generating circuit for generating this signal is required.

In consideration of these matters, if it is arranged to perform a latching operation of the latch circuits L10 and L20 in response to the falling edge of the write clock signal WCLK1 as in the present embodiment, a sufficient transfer margin can be guaranteed while preventing increase in area due to addition of circuitry.

Next, a second embodiment of the present invention will be described.

Figure 9:
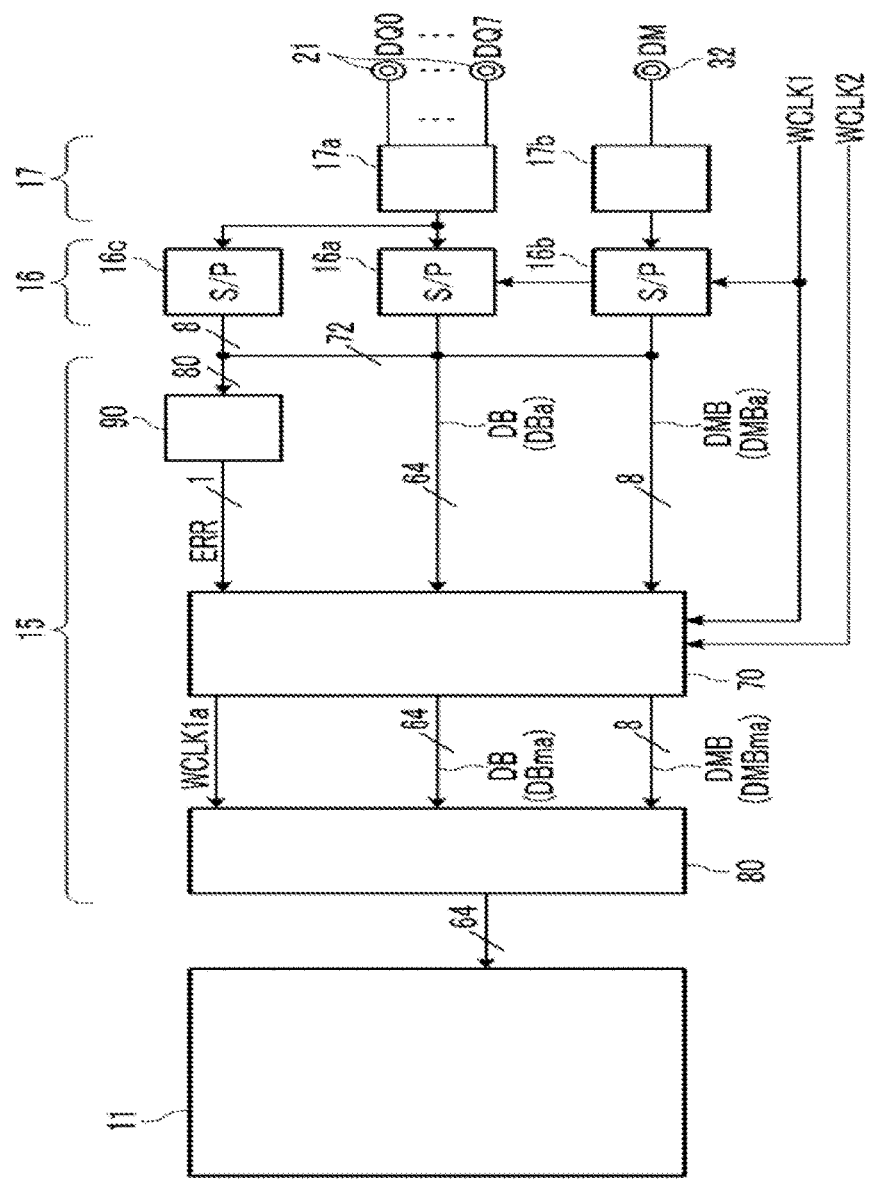
FIG. 9 is a block diagram showing a detail of a portion relating to the write operation in a semiconductor device 10 according to a second embodiment of the present invention.

FIG. 9 is a block diagram showing a detail of a portion relating to the write operation in a semiconductor device 10 according to a second embodiment of the present invention.

As shown in FIG. 9, in the present embodiment, a write clock signal WCLK1*a* is supplied to the main amplifier 80 from the error control circuit 70. As will be described, this write clock signal WCLK1*a* is a timing signal obtained by buffering the write control signal WCLK1 within the error control circuit 70.

Figure 10:
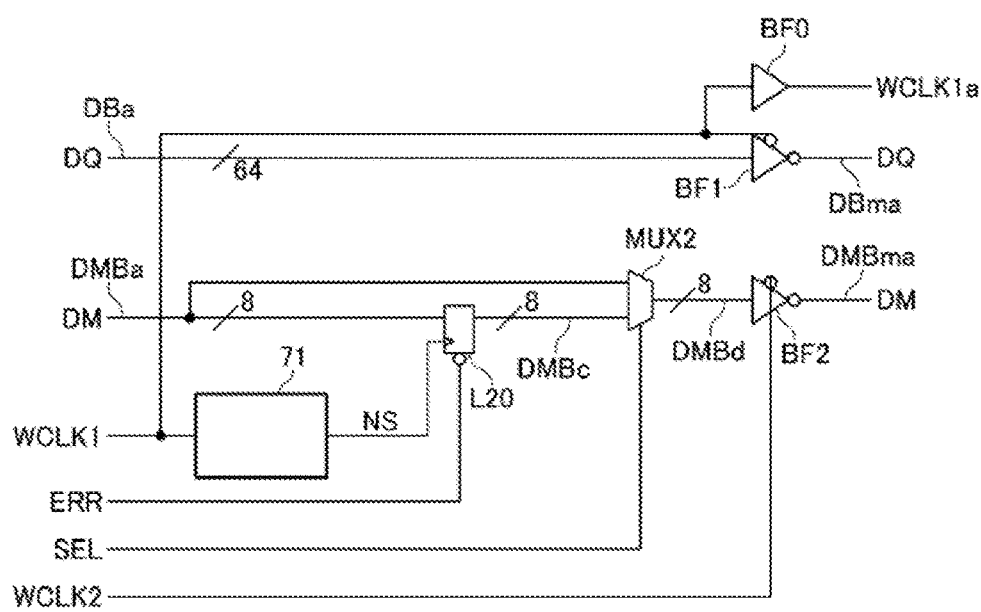
FIG. 10 is a block diagram showing the layout of an error control circuit 70 according to the second embodiment of the present invention.

FIG. 10 is a block diagram showing the layout of an error control circuit 70 according to a second embodiment of the present invention.

As shown in FIG. 10, the error control circuit 70 according to the present embodiment differs from the error control circuit 70 according to FIG. 7 in that the latch circuit L10 and the multiplexer MUX1 are dispensed with. Consequently, the section DBa of the data bus DB is directly connected with the buffer circuit BF1. In the present embodiment, the buffer circuit BF1 is activated in response to the write clock signal WCLK1.

Also, the error control circuit 70 according to the present embodiment is provided with a buffer circuit BF0 that outputs a write clock signal WCLK1*a* by buffering the write clock signal WCLK1. As described above, the write clock signal WCLK1*a* is supplied to the main amplifier 80. Other aspects are identical with the error control circuit 70 shown in FIG. 7, so duplicated description is avoided by attaching the same reference symbols to identical elements.

By means of this construction, with the error control circuit 70 according to the present embodiment, the write data DQ on the section DBa of the data bus DB is directly supplied to the buffer circuit BF1 without being latched. In contrast, the data mask signal DM is supplied to the buffer circuit BF2 in the same way as in the first embodiment, after being latched by the latch circuit L20. In the present embodiment, the timing with which the write data DQ and the data mask signal DM are input to the main amplifier 80 are different, because the buffer circuit BF1 is activated in synchronization with the write clock signal WCLK1 whereas the buffer circuit BF2 is activated in synchronization with the write clock signal WCLK2.

Figure 11:
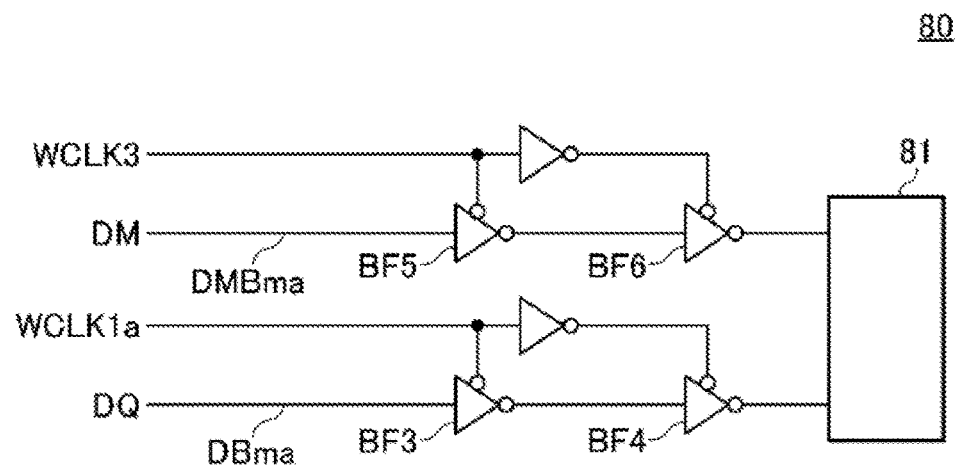
FIG. 11 is a block diagram showing the layout of a detail of a main amplifier 80 according to the second embodiment of the present invention.

FIG. 11 is a block diagram showing the layout of a detail of the main amplifier 80 according to the present embodiment.

As shown in FIG. 11, in the present embodiment, buffer circuits BF3 and BF4 perform operation synchronized with the write clock signal WCLK1a and buffer circuits BF5 and BF6 perform operation synchronized with the write clock signal WCLK3.

Figure 12:
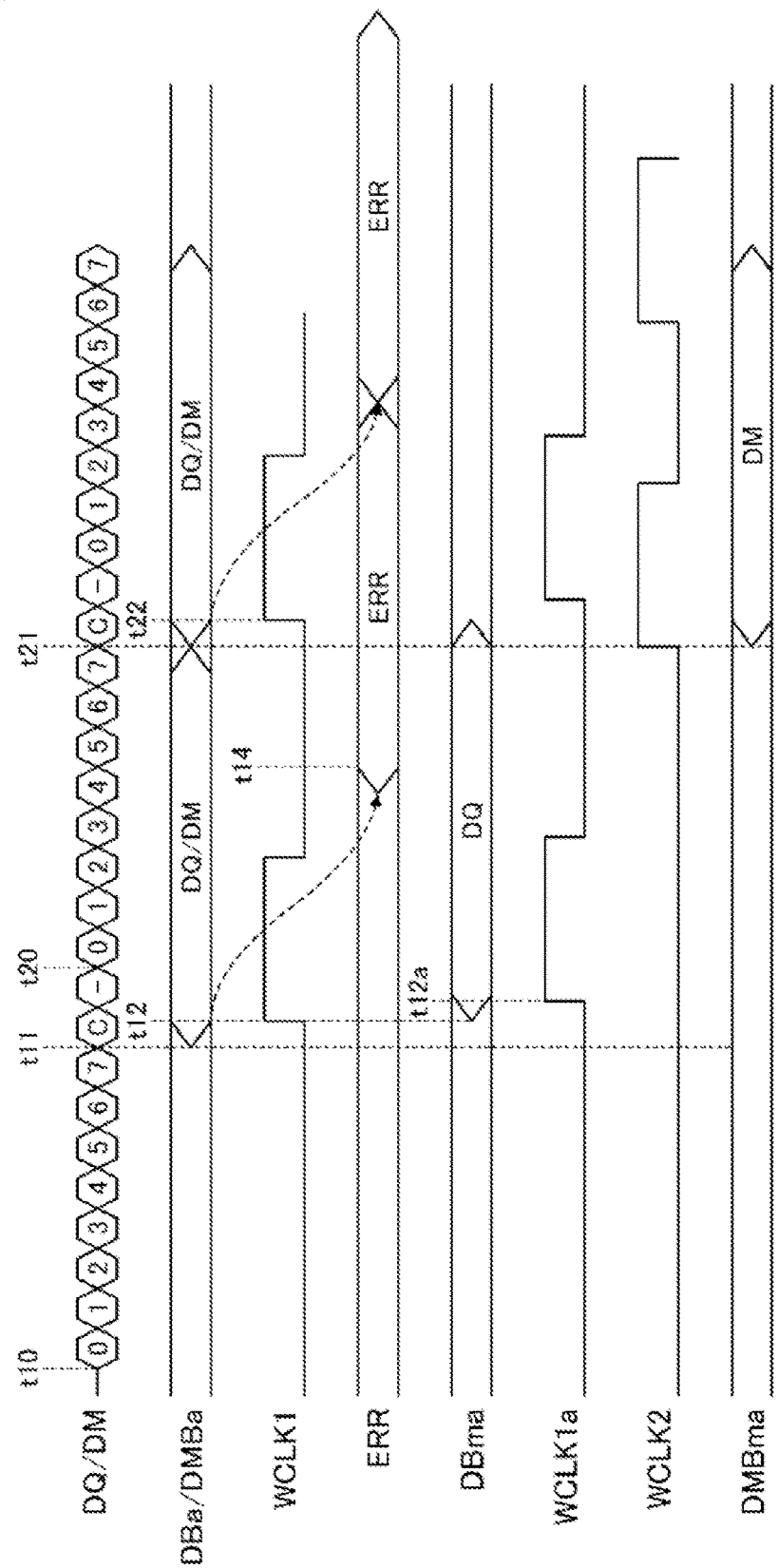
FIG. 12 is a timing chart given in explanation of the operation of the error control circuit 70 according to the second embodiment of the present invention.

FIG. 12 is a timing chart given in explanation of the operation of the error control circuit 70 according to the present embodiment.

Also in the example shown in FIG. 12, just as in the case of the examples shown in FIG. 6 and FIG. 8, the first write data DQ (and data mask signal DM) are burst-input in the period defined by the time points t10 to t11 and the second write data DQ (and data mask signal DM) are burst-input in the period defined by the time points t20 to t21.

In the present embodiment, the first burst input is completed at the time point t11, so, in this way, the write data DQ is transferred to the section DBma in synchronization with the write clock signal WCLK1 that is activated at the time point t12, after the parallel write data DQ and data mask signal DM are manifested on the data bus section DBa and the data mask bus section DMBa. Also, since the write clock signal WCLK1 is input to the buffer circuit BF0, the write clock signal WCLK1a is activated at the time point t12a which is somewhat delayed from the time point t12.

Although not shown, the transfer operation of the data mask signal DM is the same as in the first embodiment and the data mask signal DM on the section DMBa is transferred to the next section DMBc in response to the falling edge of the write clock signal WCLK1. After this, at the time point t14, the level of the error signal ERR is established and, if an error is present in the write data DQ, the data mask signal DM on the sections DMBc and DMBd is forcibly changed to active level.

In this way, with the error control circuit 70 according to the present embodiment, since the latching operation of the write data DQ synchronized with the write clock signal WCLK1 is dispensed with, the number of latch circuits can be cut to eight. This is achieved by separating the transfer timing of the write data DQ on the data bus DB and the transfer timing of the data mask signal DM on the data mask bus DMB.

Figure 13:
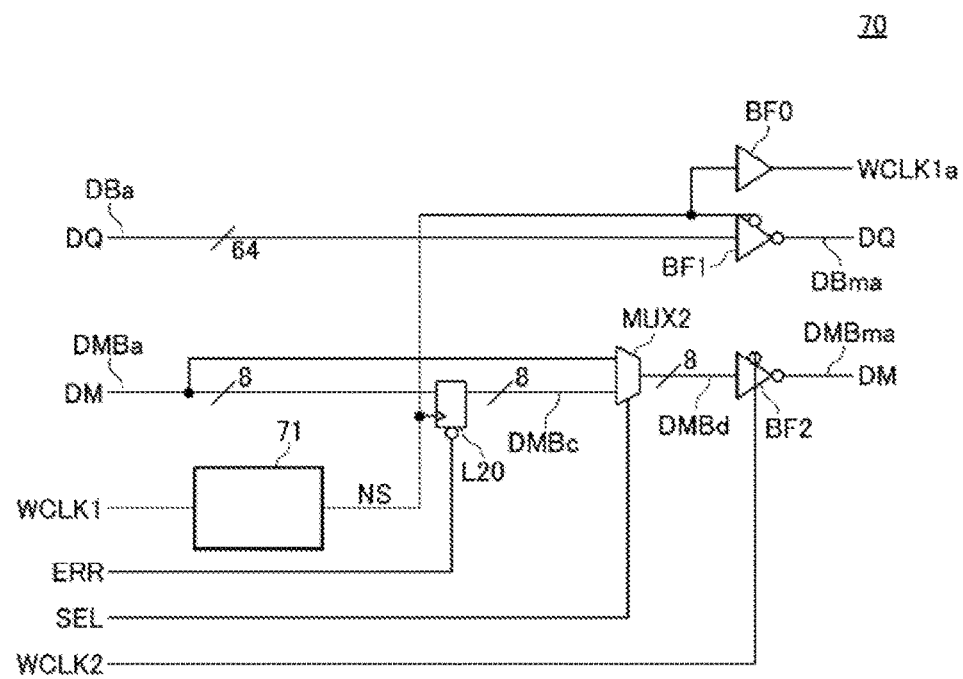
FIG. 13 is a block diagram showing the layout of the error control circuit 70 according to a modified example of the second embodiment.

FIG. 13 is a block diagram showing the layout of an error control circuit 70 according to a modified example of the second embodiment.

In the modified example shown in FIG. 13, a one-shot signal NS is employed as the transfer clock of the write data DQ, instead of the write clock signal WCLK1. With this construction also, the same beneficial effects can be obtained as in the case of the second embodiment.

While preferred embodiments of the present invention have been described above, the present invention is not restricted to the aforementioned embodiments and can be modified in various ways in a range not departing from the gist of the present invention: such modifications are of course included in the scope of the present invention.

For example, while, in the above embodiments, the write data DQ was verified using a CRC code, the method of verifying the write data DQ is not restricted to this.

EXPLANATION OF THE REFERENCE SYMBOLS

10 Semiconductor device
11 Memory cell array
12 Row decoder
13 Column decoder
14 Sensing circuit
15 Data controller
16 FIFO circuit
16a, 16b, 16c Serial/parallel conversion circuits
17 Data input/output circuit
17a, 17b Input buffers
18 Strobe circuit
19 Strobe controller
21 Data input/output terminal
22, 23 Strobe terminals
24, 25 Clock terminals
26 Clock enable terminal
27 Address terminal
28 Command terminal
29 Alert terminal
30, 31 Power source terminal
32 Data mask terminal
33 ODT terminal
40 Clock generator
41 DLL circuit
42 Mode register
43 Command decoder
44 Control logic circuit
45 Output circuit
46 Power source circuit
50 Row control circuit
51 Address buffer
52 Refresh counter
60 Column control circuit
61 Address buffer
62 Burst counter
70 Error control circuit
71 One-shot pulse generating circuit
80 Main amplifier
81 Amplifier circuit
90 Verification circuit
BF0 to BF6 Buffer circuits
BL Bit line
DB Data bus
DBa to DBd, DBma Data bus sections
DMB Data mask bus
DMBa to DMBd, DMBma Data mask bus sections
L10 to L12, L20 to L22 Latch circuits
MC Memory cell
MUX1, MUX2 Multiplexer
SA Sensing amplifier
WL Word line

The invention claimed is:

1. A semiconductor device comprising:
a verification circuit that sets an error signal to an active level in response to the presence of an error in write data comprising a plurality of bits;
a latch circuit that latches a data mask signal in response to a first timing signal and changes said latched data mask signal to an active level in response to said error signal being active-level;
a buffer circuit that outputs said data mask signal that was latched in said latch circuit in response to a second timing signal; and
a main amplifier that outputs said write data to an internal circuit under the condition that said data mask signal that was output from said buffer circuit is an inactive level;
wherein said first timing signal is activated prior to actuation of said second timing signal, said second timing signal is activated after the level of said error signal has been established, and no other latch circuit that performs latching operation synchronized with at least said first timing signal is interposed between said latch circuit and said buffer circuit.

2. The semiconductor device as claimed in claim 1, wherein said first timing signal is activated prior to the establishment of the level of said error signal.

3. The semiconductor device as claimed in claim 1 further comprising a data bus that transfers said write data to said main amplifier;
wherein said first timing signal changes from a first logic level to a second logic level with the timing with which said write data is supplied to said data bus, and, thereafter, changes from said second logic level to said first logic level prior to supply of other write data to said data bus.

4. The semiconductor device as claimed in claim 3, wherein said latch circuit latches said data mask signal in response to change of said first timing signal from said second logic level to said first logic level.

5. The semiconductor device as claimed in claim 4, further comprising another latch circuit, inserted in said data bus, that latches said write data in response to change of said first timing signal from said second logic level to said first logic level.

6. The semiconductor device as claimed in claim 4, wherein no other latch circuit that latches said write data in synchronization with said first timing signal is interposed in said data bus.

7. The semiconductor device as claimed in claim 1, wherein said internal circuit includes a memory cell array.

8. A semiconductor device comprising:
a main amplifier;
a data bus that transfers write data comprising a plurality of bits to said main amplifier;
a data mask bus that transfers a data mask signal to said main amplifier;
a verification circuit that sets an error signal to an active level in response to the presence of an error in said write data;
a control circuit that changes the first timing signal from a first logic level to a second logic level with the timing with which said write data is supplied to said data bus and thereafter changes said first timing signal from said second logic level to said first logic level prior to supply of other write data to said data bus;
a latch circuit inserted in said data mask bus that latches said data mask signal in response to change of said first timing signal from said second logic level to said first logic level; and
a buffer circuit inserted in said data mask bus that outputs said data mask signal that was latched in said latch circuit to said main amplifier;
wherein said latch circuit, when said error level is an inactive level, outputs said data mask signal of the same level as the level of said data mask signal that was input through said data mask bus to said buffer circuit and, when said error signal is an active level, forcibly sets said data mask signal that is output to said buffer circuit to an active level, irrespective of the level of said data mask signal that was input through said data mask bus, and wherein said main amplifier is activated under the condition that said data mask signal that is output from said buffer circuit is an inactive level.

9. The semiconductor device as claimed in claim 8, further comprising another latch circuit, inserted in said data bus, that latches said write data in response to change of said first timing signal from said second logic level to said first logic level.

10. The semiconductor device as claimed in claim 8, wherein no other latch circuit that latches said write data in synchronization with said first timing signal is interposed in said data bus.

11. The semiconductor device as claimed in claim 8, wherein said first timing signal changes from said second logic level to said first logic level prior to establishment of the level of said error signal.

12. The semiconductor device as claimed in claim 8, wherein said buffer circuit is activated in response to the second timing signal, which is activated after change of said first timing signal from said second logic level to said first logic level.

* * * * *